(12) United States Patent
Wu et al.

(10) Patent No.: US 11,585,337 B2
(45) Date of Patent: Feb. 21, 2023

(54) FLUID DRIVING DEVICE

(71) Applicant: KOGE MICRO TECH CO., LTD., New Taipei (TW)

(72) Inventors: Chung-Han Wu, New Taipei (TW); Jun-Yan Huang, New Taipei (TW); Hsin-Cheng Wang, New Taipei (TW)

(73) Assignee: KOGE MICRO TECH CO., LTD., New Taipei (TW)

( * ) Notice: Subject to any disclaimer, the term of this patent is extended or adjusted under 35 U.S.C. 154(b) by 0 days.

(21) Appl. No.: 17/526,257

(22) Filed: Nov. 15, 2021

(65) Prior Publication Data
US 2022/0074403 A1    Mar. 10, 2022

Related U.S. Application Data

(62) Division of application No. 16/535,089, filed on Aug. 8, 2019, now Pat. No. 11,248,597.

(30) Foreign Application Priority Data

Aug. 13, 2018 (TW) .................................. 107128142

(51) Int. Cl.
*F04B 43/04* (2006.01)
*H01L 41/09* (2006.01)
*F04B 43/073* (2006.01)

(52) U.S. Cl.
CPC .......... *F04B 43/046* (2013.01); *F04B 43/073* (2013.01); *H01L 41/0973* (2013.01)

(58) Field of Classification Search
CPC .... F04B 43/043; F04B 43/046; F04B 43/073; F04B 45/047; F16K 99/0048; H01L 41/09; H01L 41/047
See application file for complete search history.

(56) References Cited

U.S. PATENT DOCUMENTS

2004/0000843 A1   1/2004 East
2008/0180491 A1   7/2008 Sugahara
(Continued)

FOREIGN PATENT DOCUMENTS

CN    107735573    2/2018
EP    0609561      8/1994
(Continued)

OTHER PUBLICATIONS

Steghaus, Machine Translation of EP-0609561, Aug. 1994 (Year: 1994).

*Primary Examiner* — Kenneth J Hansen
(74) *Attorney, Agent, or Firm* — Juan Carlos A. Marquez; Marquez IP Law Office, PLLC

(57) ABSTRACT

A fluid driving device includes a vibration unit, a signal transmission layer, a piezoelectric element, and a plane unit. The signal transmission layer includes a first conductive zone and a second conductive zone. The piezoelectric element includes a first electrode and a second electrode electrically isolated from each other. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The signal transmission layer, the piezoelectric element, and the plane unit are located at one side of the vibration unit and sequentially stacked with each other.

5 Claims, 9 Drawing Sheets

(56) References Cited

U.S. PATENT DOCUMENTS

2016/0107194 A1   4/2016   Panchawagh et al.
2017/0219121 A1   8/2017   Chen et al.

FOREIGN PATENT DOCUMENTS

| JP | H09247781 | 9/1997 |
| JP | 2000224874 | 8/2000 |
| JP | 2010263061 | 11/2010 |
| TW | M570534 | 11/2018 |

FLUID DRIVING DEVICE

CROSS-REFERENCE TO RELATED APPLICATION

This application is a divisional of and claims priority to U.S. patent application Ser. No. 16/535,089 filed on Aug. 8, 2019, which claims the priority benefit of Taiwan application serial no. 107128142, filed on Aug. 13, 2018. The entirety of the above-mentioned patent applications are hereby incorporated in their entireties herein and made part of this specification by reference.

BACKGROUND

Technical Field

The disclosure relates to a fluid driving device, and more particularly to a fluid driving device whose signal transmission layer electrically connected to a piezoelectric element can be better protected.

Description of Related Art

A piezoelectric pump is a new type of fluid driver, which does not require any additional driving motor and can deform a piezoelectric vibrator only by an inverse piezoelectric effect of piezoelectric ceramics, and fluid output can be realized due to the volume change of the pump chamber resulting from said deformation, or fluids can be transported through vibration of the piezoelectric vibrator. Therefore, piezoelectric pumps have gradually replaced traditional pumps and are widely used in electronics, biomedical, aerospace, automotive, and petrochemical industries.

In general, a piezoelectric pump is composed of a piezoelectric element and a pump body. When electricity is supplied to the piezoelectric element, the piezoelectric element is radially compressed due to an electric field and is subject to internal tensile stress and is then bent and deformed. When the piezoelectric element is bent in a positive direction, the volume of the chamber of the pump body (hereinafter referred to as the pump chamber) is increased, so that the pressure in the pump chamber is reduced to allow fluid to flow into the pump chamber from the inlet. On the other hand, when the piezoelectric element is bent in a reverse direction, the volume of the pump chamber is reduced, so that the pressure in the pump chamber is increased, and that the fluid in the pump chamber is squeezed and discharged from the outlet. At present, the circuit structure used to supply electricity to the piezoelectric element is often a multi-layer structure and is located outside the pump body; thus, the overall volume is large, and the structure may be easily damaged.

SUMMARY

The disclosure provides a fluid driving device whose signal transmission layer electrically connected to a piezoelectric element can be better protected.

In an embodiment of the disclosure, a fluid driving device includes a vibration unit, a signal transmission layer, a piezoelectric element, and a plane unit. The signal transmission layer includes a first conductive zone and a second conductive zone. The piezoelectric element includes a first electrode and a second electrode electrically isolated from each other. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The signal transmission layer, the piezoelectric element, and the plane unit are located at one side of the vibration unit and sequentially stacked with each other.

According to an embodiment of the disclosure, the fluid driving device further includes a transmission unit located between the vibration unit and the piezoelectric element, and the transmission unit is a flexible printed circuit board (FPCB).

According to an embodiment of the disclosure, the fluid driving device further includes a frame and a protrusion. The vibration unit includes a first central zone and a first peripheral zone, and the frame is disposed between the first peripheral zone and the plane unit. The protrusion is disposed at a location corresponding to the at least one hole and between the first central zone and the plane unit and protrudes toward the at least one hole, and a surface of the frame facing the plane unit is coplanar with a surface of the protrusion facing the plane unit.

According to an embodiment of the disclosure, the transmission unit includes a second central zone corresponding to the piezoelectric element and a second peripheral zone located outside the second central zone, the piezoelectric element is fixed to the second central zone of the transmission unit, and the frame is fixed to the second peripheral zone of the transmission unit.

According to an embodiment of the disclosure, the frame is fixed to the first peripheral zone of the vibration unit.

According to an embodiment of the disclosure, the piezoelectric element includes a through hole, and the protrusion passes through the through hole.

According to an embodiment of the disclosure, the transmission unit includes an opening corresponding to the through hole, and the protrusion passes through the opening and is fixed to the first central zone of the vibration unit.

According to an embodiment of the disclosure, the fluid driving device further includes a protrusion. The vibration unit includes a first central zone and a first peripheral zone, the protrusion is disposed at a location corresponding to the at least one hole and between the first central zone and the plane unit and protrudes toward the at least one hole, a thickness of the first peripheral zone is greater than a thickness of the first central zone, and a surface of the first peripheral zone facing the plane unit is coplanar with a surface of the protrusion facing the plane unit.

According to an embodiment of the disclosure, the protrusion of the fluid driving device is located on a surface of the piezoelectric element facing the plane unit.

According to an embodiment of the disclosure, the fluid driving device further includes a support member that includes a third central zone and a third peripheral zone, the third central zone of the support member is disposed between the piezoelectric element and the plane unit and forms a protrusion corresponding to the at least one hole and protruding toward the at least one hole, and the third peripheral zone of the support member is disposed between a first peripheral zone of the vibration unit and the plane unit.

According to an embodiment of the disclosure, the fluid driving device further includes a fluid guiding member, the plane unit is located between the piezoelectric element and the fluid guiding member, and the fluid guiding member includes at least one through hole.

In view of the above, the signal transmission layer, the piezoelectric element, and the plane unit of the fluid driving device provided in the disclosure are respectively located on the same side of the vibration unit and are sequentially stacked. The signal transmission layer configured to be electrically connected to the first electrode and the second electrode of the piezoelectric element is located between the vibration unit and the plane unit; that is, the signal transmission layer is formed inside the fluid driving device and can be better protected.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
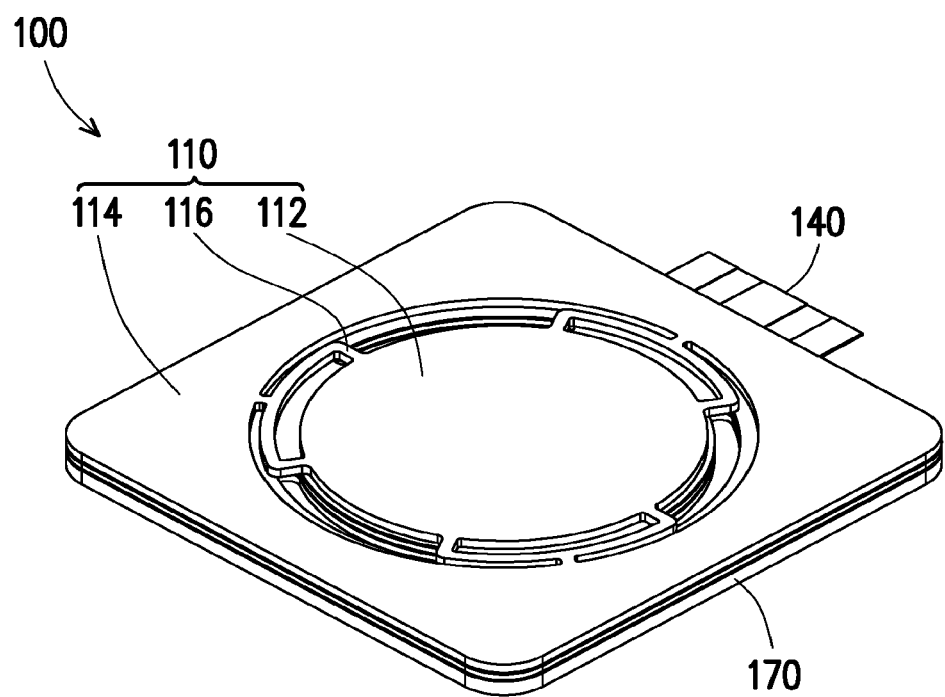
FIG. 1 is a schematic view of a fluid driving device according to a first embodiment of the disclosure.
Figure 2:
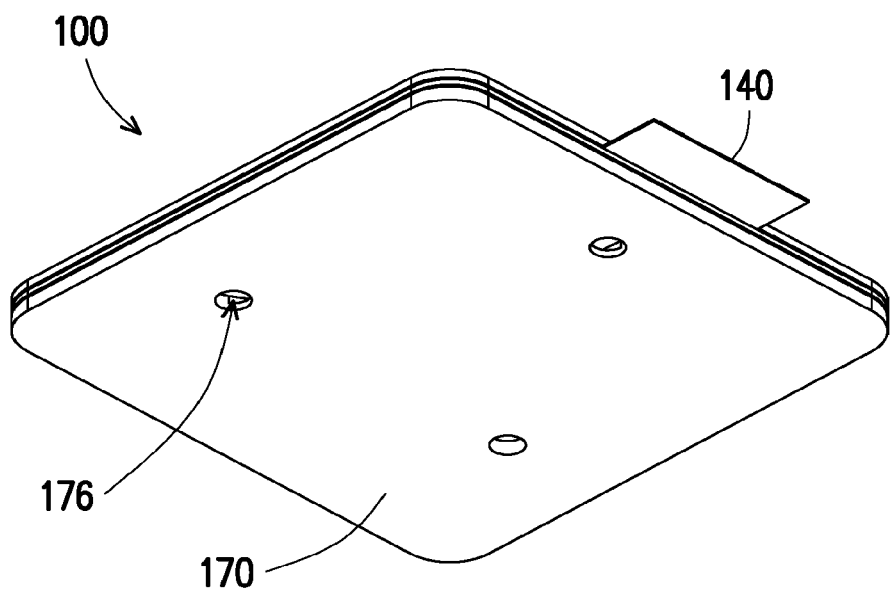
FIG. 2 is a schematic view of FIG. 1 at another view angle.
Figure 3:
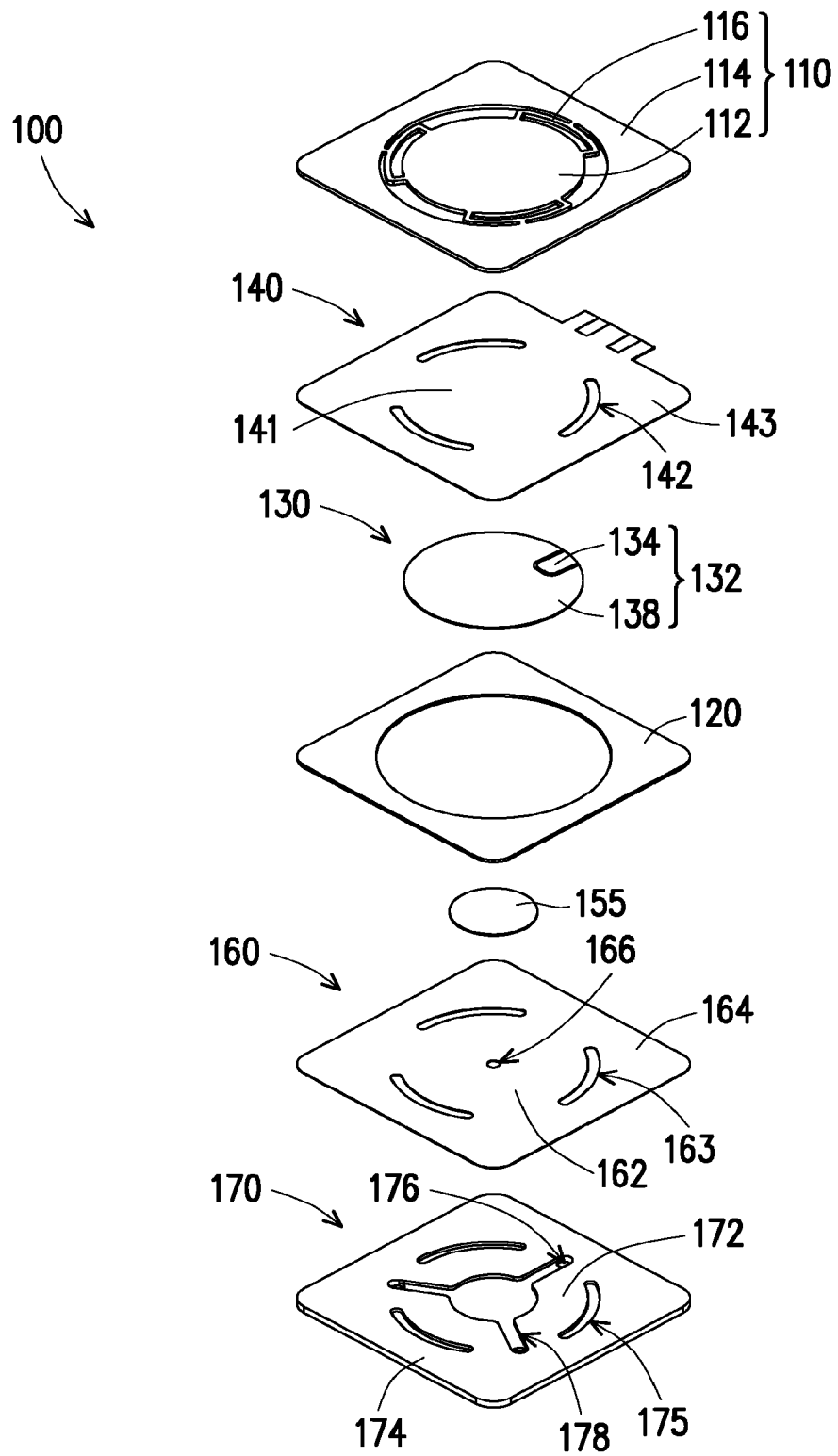
FIG. 3 is a schematic exploded view of FIG. 1.
Figure 4:
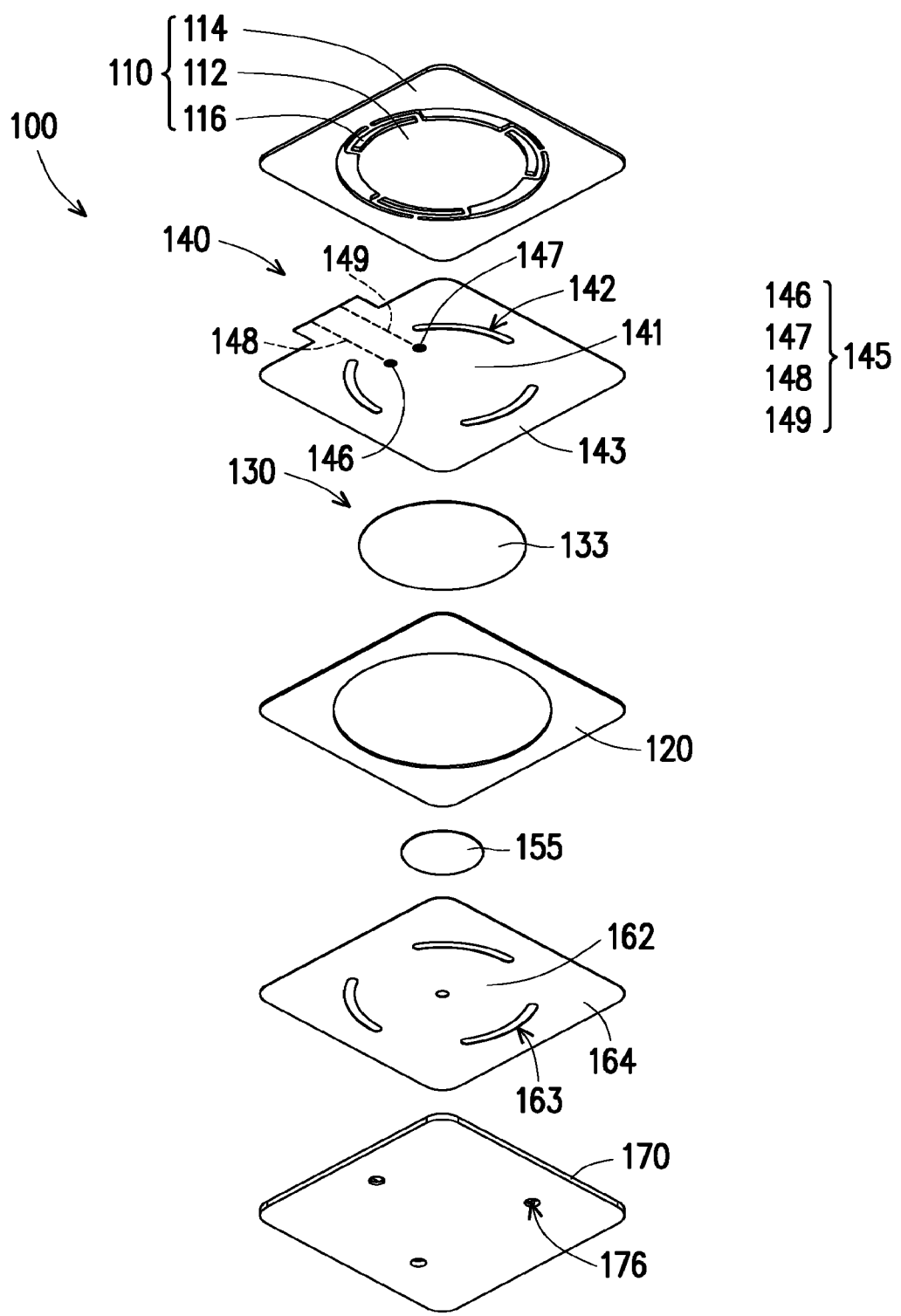
FIG. 4 is a schematic exploded view of FIG. 2.
Figure 5:
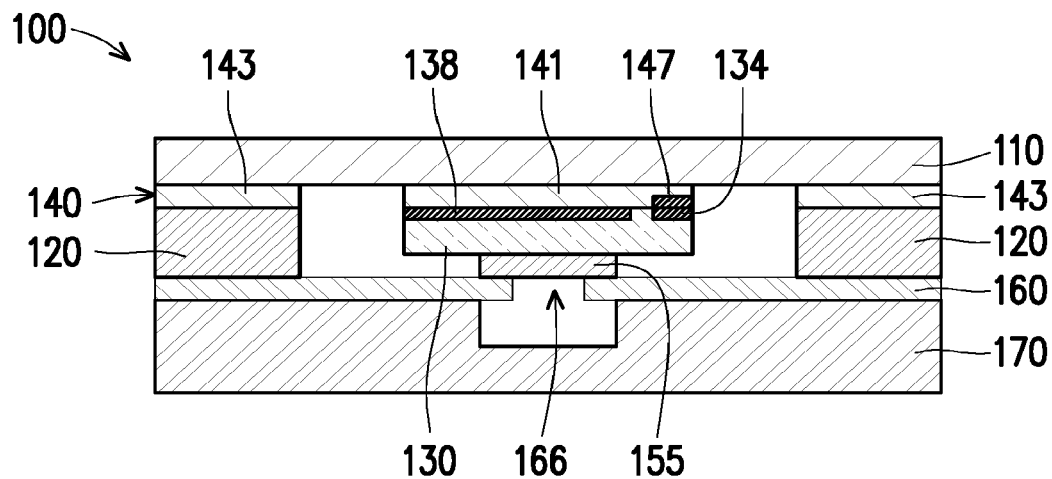
FIG. 5 is a schematic cross-sectional view illustrating the fluid driving device depicted in FIG. 1.

FIG. 1 is a schematic view of a fluid driving device according to a first embodiment of the disclosure. FIG. 2 is a schematic view of FIG. 1 at another view angle. FIG. 3 is a schematic exploded view of FIG. 1. FIG. 4 is a schematic exploded view of FIG. 2. FIG. 5 is a schematic cross-sectional view illustrating the fluid driving device depicted in FIG. 1. With reference to FIG. 1 to FIG. 5, the fluid driving device 100 provided in the embodiment includes a vibration unit 110, a signal transmission layer 145, a piezoelectric element 130, and a plane unit 160. The fluid driving device 100 will be described in detail below.

With reference to FIG. 3 and FIG. 4, in the present embodiment, the vibration unit 110 includes a first central zone 112, a first peripheral zone 114, and a plurality of first connection zones 116 connected to the first central zone 112 and the first peripheral zone 114. The first central zone 112 is movable relative to the first peripheral zone 114. In addition, in the embodiment, the material of the vibration unit 110 may include a metal or an alloy and has a flexible property, but the material of the vibration unit 110 is not limited thereto. In other embodiments, the vibration unit 110 can also be made of flexible rubber, silicone, or other non-metallic materials.

In the present embodiment, the piezoelectric element 130 has a first surface 132 (marked in FIG. 3) and a second surface 133 (marked in FIG. 4), and the first surface 132 of the piezoelectric element 130 faces the vibration unit 110. In the present embodiment, the piezoelectric element 130 includes a first electrode 134 and a second electrode 138 that are located on the first surface 132 and are electrically isolated from each other. One of the first electrode 134 and the second electrode 138 is a positive electrode, and the other is a negative electrode. In addition, in the embodiment, the shape of the piezoelectric element 130 may be a sheet shape or an arbitrary geometric shape, and the outer contour of the piezoelectric element 130 may be an arc, a polygon, a rectangle, and so on. The shape of the piezoelectric element 130 is not limited in the disclosure.

As shown in FIG. 4, in the present embodiment, the signal transmission layer 145 includes a first transmission zone 149 and a second transmission zone 148 that are electrically isolated. More specifically, in the present embodiment, the fluid driving device 100 further includes a transmission unit 140 located between the piezoelectric element 130 and the vibration unit 110. The transmission unit 140 is a flexible printed circuit board (FPCB). The transmission unit 140 includes a second central zone 141 surrounded by a plurality of slots 142 and corresponding to the piezoelectric element 130 and a second peripheral zone 143 located outside the second central zone 141. The piezoelectric element 130 is fixed to the second central zone 141 of the transmission unit 140. A first transmission zone 149 and a second transmission zone 148 are formed on the transmission unit 140, respectively. The first transmission zone 149 and the second transmission zone 148 on the transmission unit 140 are electrically isolated and insulated from each other so as to be not electrically connected to each other. More specifically, the first transmission zone 149 and the second transmission zone 148 extend to the second central zone 141 of the transmission unit 140, respectively, and are connected to a first conductive zone 147 and a second conductive zone 146 located in the second central zone 141.

With reference to FIG. 3 and FIG. 4 together, in the present embodiment, the first electrode 134 of the piezoelectric element 130 (marked in FIG. 3) is electrically connected to the first transmission zone 149 (marked in FIG. 4) of the signal transmission layer 145 through the first conductive zone 147, and the second electrode 138 of the piezoelectric element 130 (marked in FIG. 3) is electrically connected to the second transmission zone 148 (marked in FIG. 4) of the signal transmission layer 145 through the second conductive zone 146.

Certainly, in other embodiments, the first transmission zone 149 and the second transmission zone 148 may also be two general-purpose wires or may be directly connected to the first electrode 134 and the second electrode 138 of the piezoelectric element 130, and the first transmission zone 149 and the second transmission zone 148 are not necessarily formed on the transmission unit 140. In addition, the first transmission zone 149 and the second transmission zone 148 are not necessarily formed in the same layer; as long as the first transmission zone 149 and the second transmission zone 148 are electrically connected to the first electrode 134 and the second electrode 138 of the piezoelectric element 130, the structure of these zones is not limited to the structure described above.

In the present embodiment, the plane unit 160 is a valve plate, but the form of the plane unit 160 is not limited thereto. The plane unit 160 includes three arc-shaped slots 163 that surround a circular fourth central zone 162 and distinguish a fourth peripheral zone 164 outside the fourth central zone 162. The location of the fourth central zone 162 corresponds to the location of the piezoelectric element 130. In the present embodiment, the plane unit 160 further includes a hole 166 formed in the fourth central zone 162. In other embodiments, the number and the shape of the slots 163 of the plane unit 160 should not be construed as limitations. Besides, the material of the plane unit 160 may include metal or a non-conductive material, which is slightly flexible, but the material of the plane unit 160 should not be limited to the material provided herein.

According to the present embodiment, note that the fluid driving device 100 further includes a frame 120 and a protrusion 155. The frame 120 is disposed between the first peripheral zone 114 of the vibration unit 110 and the plane unit 160. More specifically, in the present embodiment, the frame 120 is fixed between the second peripheral zone 143 of the transmission unit 140 and the fourth peripheral zone 164 of the plane unit 160. The protrusion 155 is disposed between the first central zone 112 of the vibration unit 110 and the fourth central zone 162 of the plane unit 160. As shown in FIG. 5, in the present embodiment, the protrusion 155 is located on a surface of the piezoelectric element 130 facing the plane unit 160, and the protrusion 155 protrudes toward the hole 166.

As shown in FIG. 5, in the present embodiment, the protrusion 155 is located on a surface of the piezoelectric element 130 facing the plane unit 160, and the protrusion 155 protrudes toward the hole 166. Besides, in the present embodiment, it can be observed from FIG. 5 that a surface of the frame 120 facing the plane unit 160 is coplanar with a surface of the protrusion 155 facing the plane unit 160. As such, after the fluid driving device 100 is completely assembled, the protrusion 155 can push against a portion of the plane unit 160 near the hole 166, so as to ensure that at a certain moment of actuation (e.g., at the time shown in FIG. 5), the protrusion 155 pushes against the hole 166, such that fluid (not shown) does not pass through the hole 166. In this embodiment, the frame 120 and the protrusion 155 may be made of metal, ceramics, plastic, etc., and the types of the materials of the frame 120 and the protrusion 155 are not limited in the disclosure.

In addition, as shown in FIG. 3, in the present embodiment, the fluid driving device 100 further includes a fluid guiding member 170, and the plane unit 160 is located between the piezoelectric element 130 and the fluid guiding member 170. In this embodiment, the fluid guiding member 170 includes a fifth central zone 172 surrounded by three grooves 175 and corresponding to the piezoelectric element 130, a fifth peripheral zone 174 located outside the fifth central zone 172, three through holes 176 penetrating the fluid guiding member 170, and three flow paths 178 respectively communicating with the three through holes 176. Certainly, the number of the grooves 175, the through holes 176, and the low paths 178 of the fluid guiding member 170 are not limited thereto.

In the present embodiment, the fifth peripheral zone 174 of the fluid guiding member 170 is attached to the fourth peripheral zone 164 of the plane unit 160, and the fourth central zone 162 of the plane unit 160 is movable relative to the fourth peripheral zone 164. Besides, in this embodiment, the material of the fluid guiding member 170 may include metal or an alloy, which should however not be construed as a limitation in the disclosure.

In the present embodiment, note that the transmission unit 140 having the signal transmission layer 145, the piezoelectric element 130, and the plane unit 160 are located at the same side of the vibration unit 110 and are sequentially stacked together. That is, in the present embodiment, the transmission unit 140 having the signal transmission layer 145 and the piezoelectric element 130 are located between the vibration unit 110 and the plane unit 160. Since the signal transmission layer 145 is mainly formed within the fluid driving device 100, the signal transmission layer 145 of the fluid driving device 100 provided in the present embodiment can be better protected.

In the fluid driving device 100 provided in the present embodiment, the signal transmission layer 145 electrically connected to the piezoelectric element 130 is disposed on one single transmission unit 140 located between the vibration unit 110 and the piezoelectric element 130. Since the signal transmission layer 145 is formed on one single transmission unit 140, the overall thickness of the fluid driving device 100 provided in the present embodiment is smaller than that of the conventional fluid driving device having a plurality of signal transmission layers, and the fluid driving device 100 provided in the present embodiment can be easily assembled.

Other types of fluid driving devices 100a, 100b, and 100c will be described below. The same or similar elements provided in the following embodiment and the previous embodiment will be denoted by the same or similar reference numerals and will not be described again, but the main differences between these embodiments will be explained below.

Figure 6:
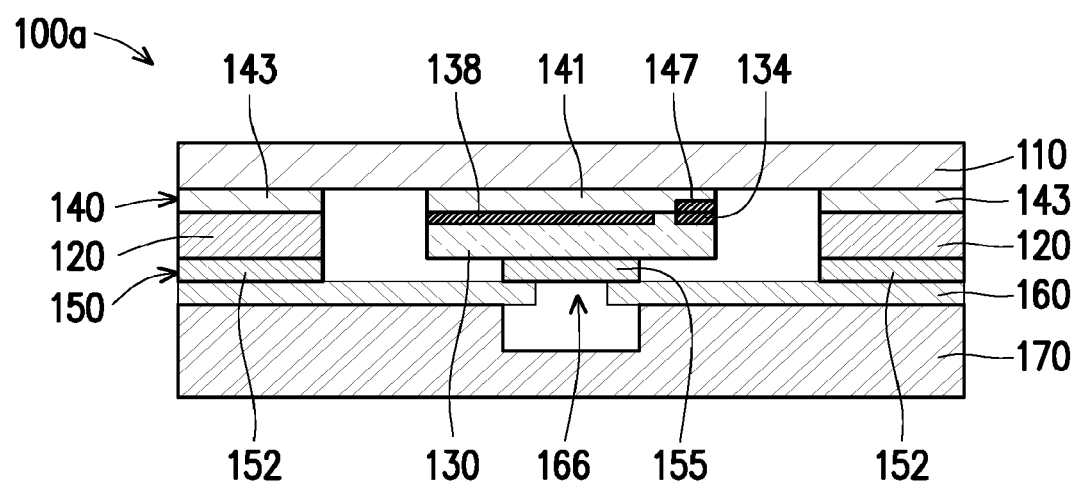
FIG. 6 is a schematic cross-sectional view of a fluid driving device according to a second embodiment of the disclosure.

FIG. 6 is a schematic cross-sectional view of a fluid driving device according to a second embodiment of the disclosure. With reference to FIG. 6, the main difference between the fluid driving device 100a provided in the present embodiment and the fluid driving device 100 provided in the previous embodiment (e.g., shown in FIG. 5) is that the thickness of the frame 120 is substantially the same as the sum of the thickness of the piezoelectric element 130 and the thickness of the protrusion 155 in the previous embodiment as shown in FIG. 5.

In the present embodiment as shown in FIG. 6, the thickness of the frame 120 is substantially the same as the thickness of the piezoelectric element 130. Besides, in the present embodiment, the fluid driving device 100a further includes a support member 150 that includes a third central zone and a third peripheral zone 152. The third central zone of the support member 150 is disposed between the piezoelectric element 130 and the plane unit 160 as a protrusion 155 corresponding to the hole 166 and protruding toward the hole 166. The third peripheral zone 152 of the support member 150 is disposed between the vibration unit 110 and the plane unit 160. More specifically, the third peripheral zone 152 of the support member 150 is located between the frame 120 and the plane unit 160.

In this embodiment, the support member 150 may be made of metal, ceramics, plastic, etc., and the types of the materials of the support member 150 are not limited in the disclosure. In this embodiment, the third central zone (i.e., the protrusion 155) and the third peripheral zone 152 of the support member 150 can be made of the same object, so as to ensure that the thickness of the third central zone (i.e., the protrusion 155) is the same as the thickness of the third peripheral zone 152. This not only guarantees the flatness of the fluid driving device 100a but also simplifies the fabrication of the fluid driving device 100a.

Figure 7:
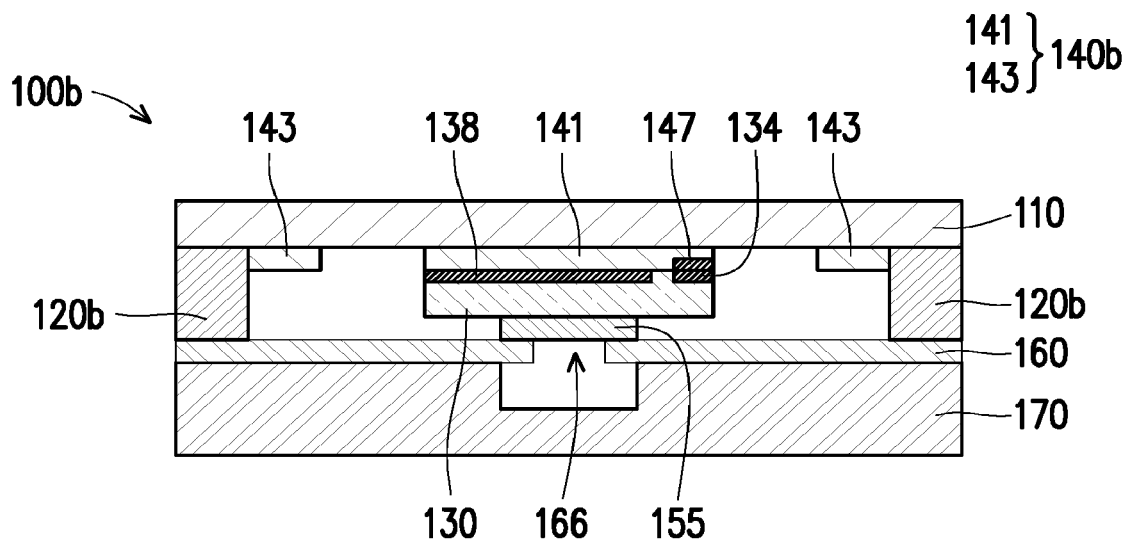
FIG. 7 is a schematic cross-sectional view of a fluid driving device according to a third embodiment of the disclosure.

FIG. 7 is a schematic cross-sectional view of a fluid driving device according to a third embodiment of the disclosure. The frame is fixed to the first peripheral zone of the vibration unit. With reference to FIG. 7, the main difference between the fluid driving device 100b provided in the present embodiment and the fluid driving device 100 provided in the embodiment shown in FIG. 5 lies in that the distribution area of the frame 120 corresponds to the distribution area of the second peripheral zone 143 of the transmission unit 140 in the embodiment shown in FIG. 5. That is, in the previous embodiment, the frame 120 is stacked in the second peripheral zone 143 of the transmission unit 140.

In the present embodiment, an outer contour of the second peripheral zone 143 of the transmission unit 140b is smaller than the inner contour of the frame 120b, and the transmission unit 140b is located within the range of the frame 120b. In the present embodiment, it can be observed from FIG. 7 that the frame 120b and the second peripheral zone 143 of the transmission unit 140b are in contact with the vibration unit 110, respectively. Therefore, the second peripheral zone 143 of the transmission unit 140b does not overlap the frame 120b.

In the present embodiment as shown in FIG. 7, the thickness of the frame 120b is substantially the same as the sum of the thickness of the transmission unit 140b, the thickness of the piezoelectric element 130, and the thickness of the protrusion 155. That is, a surface of the frame 120b facing the plane unit 160 is coplanar with a surface of the protrusion 155 facing the plane unit 160. As such, after the fluid driving device 100 is completely assembled, the protrusion 155 can push against a portion of the plane unit 160 near the hole 166, so as to ensure that at a certain moment of actuation (e.g., at the time shown in FIG. 5), the protrusion 155 pushes against the hole 166, such that fluid (not shown) does not pass through the hole 166.

Figure 8:
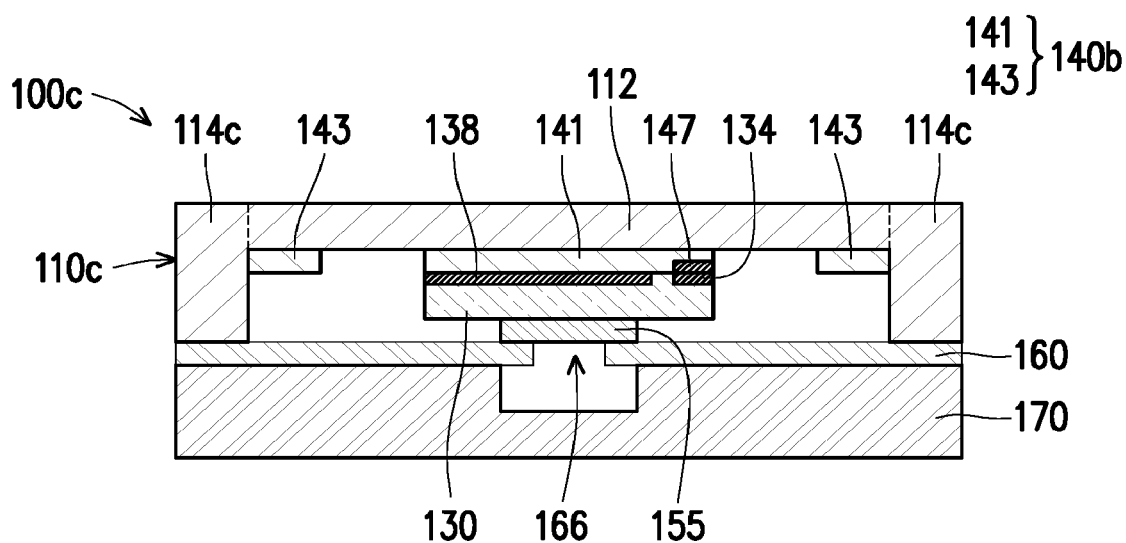
FIG. 8 is a schematic cross-sectional view of a fluid driving device according to a fourth embodiment of the disclosure.

FIG. 8 is a schematic cross-sectional view of a fluid driving device according to a fourth embodiment of the disclosure. With reference to FIG. 8, the main difference between the fluid driving device 100c provided in the present embodiment and the fluid driving device 100b provided in the embodiment shown in FIG. 7 lies in that the thickness of the first peripheral zone 114c of the vibration unit 110c is greater than the thickness of the first central zone 112. More specifically, in the present embodiment, the vibration unit 110c is similar to the combination of the vibration unit 110 and the frame 120b depicted in FIG. 7.

In the present embodiment, a surface of the first peripheral zone 114c of the vibration unit 110c facing the plane unit 160 is coplanar with a surface of the protrusion 155 facing the plane unit 160. As such, after the fluid driving device 100c is completely assembled, the protrusion 155 can push against a portion of the plane unit 160 near the hole 166, so as to ensure that at a certain moment of actuation (e.g., at the time shown in FIG. 5), the protrusion 155 pushes against the hole 166, such that fluid (not shown) does not pass through the hole 166.

Figure 9:
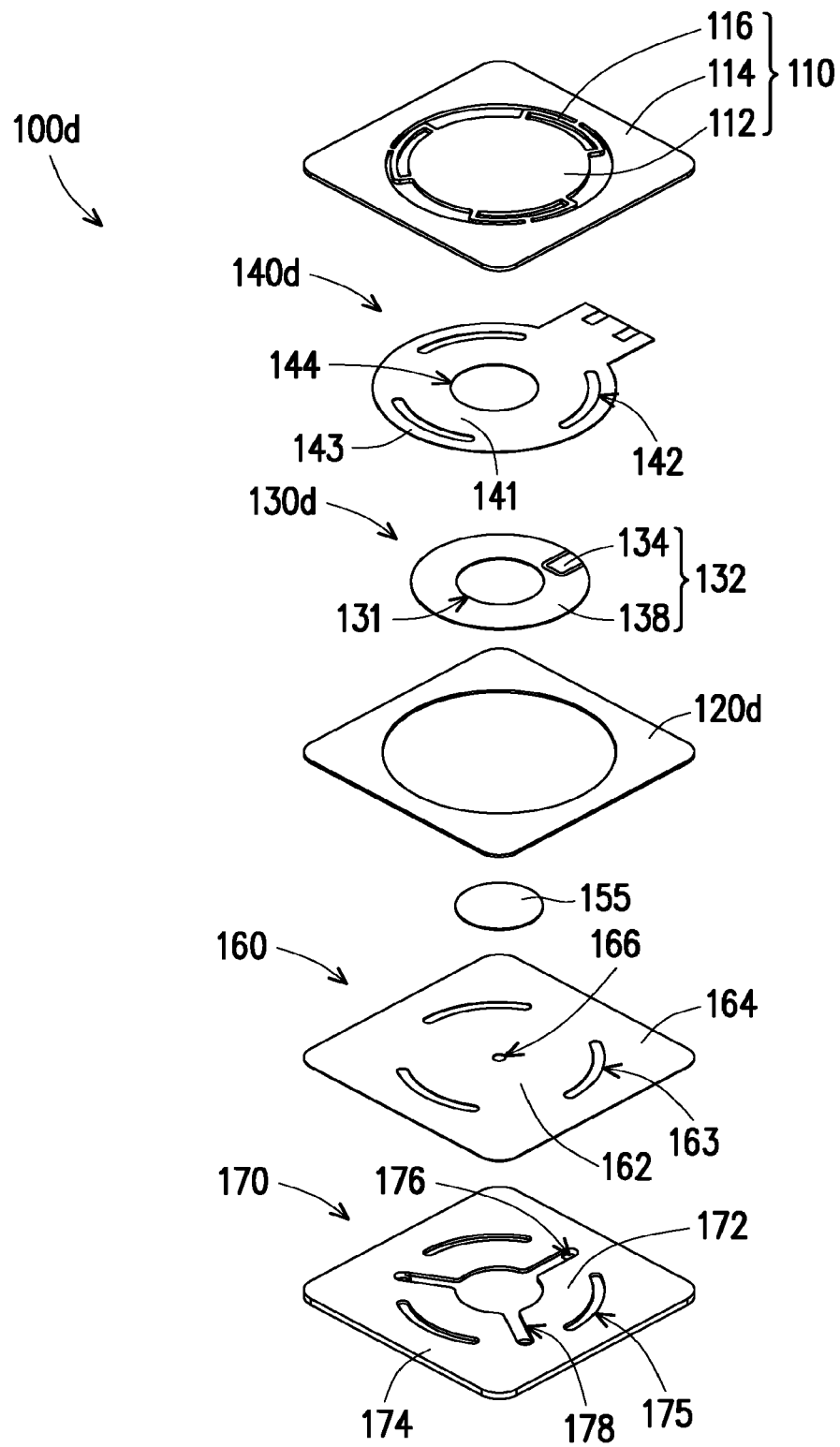
FIG. 9 is a schematic exploded view of a fluid driving device according to a fifth embodiment of the disclosure.
Figure 10:
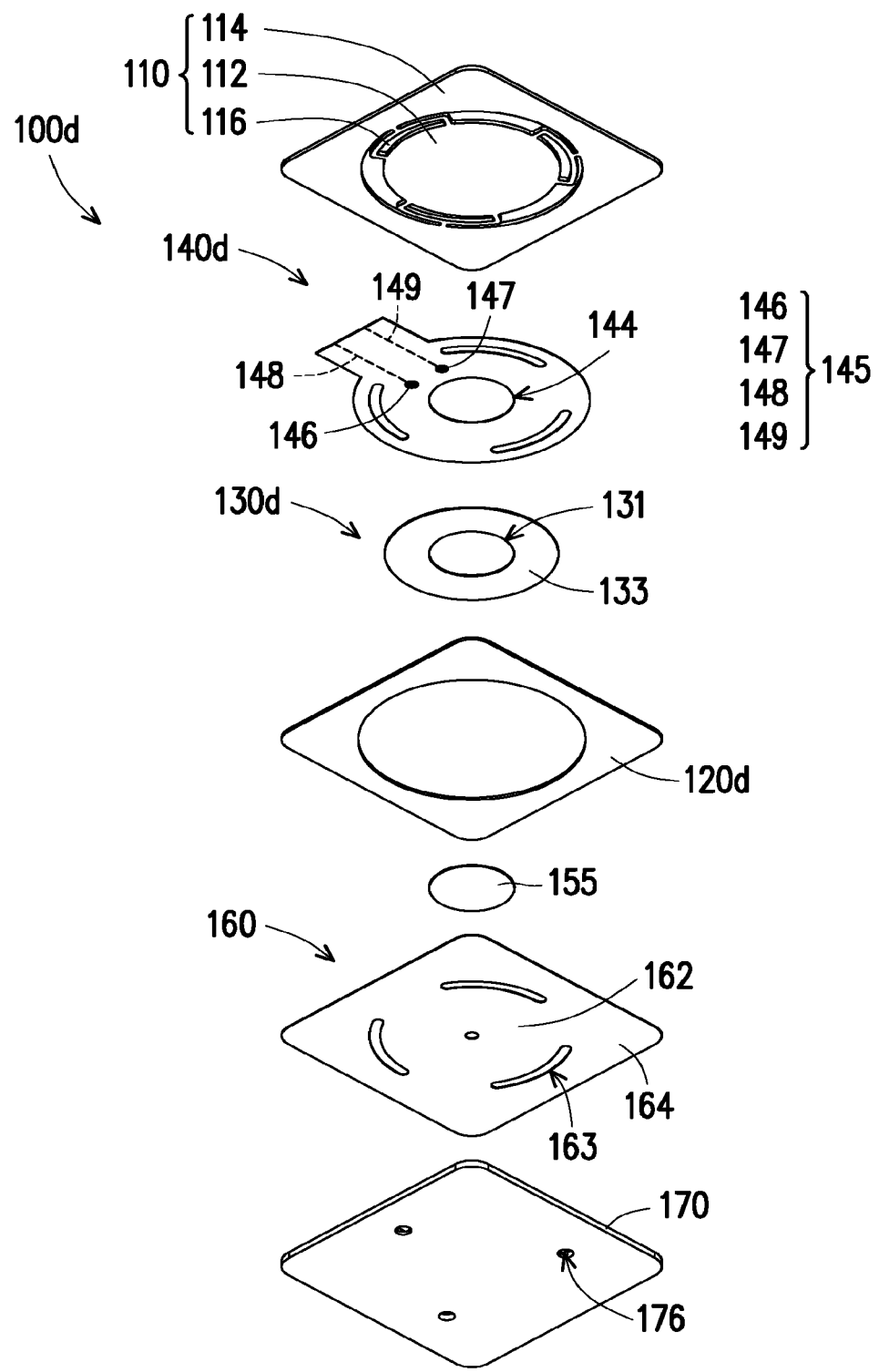
FIG. 10 is a schematic view of FIG. 9 at another view angle.
Figure 11:
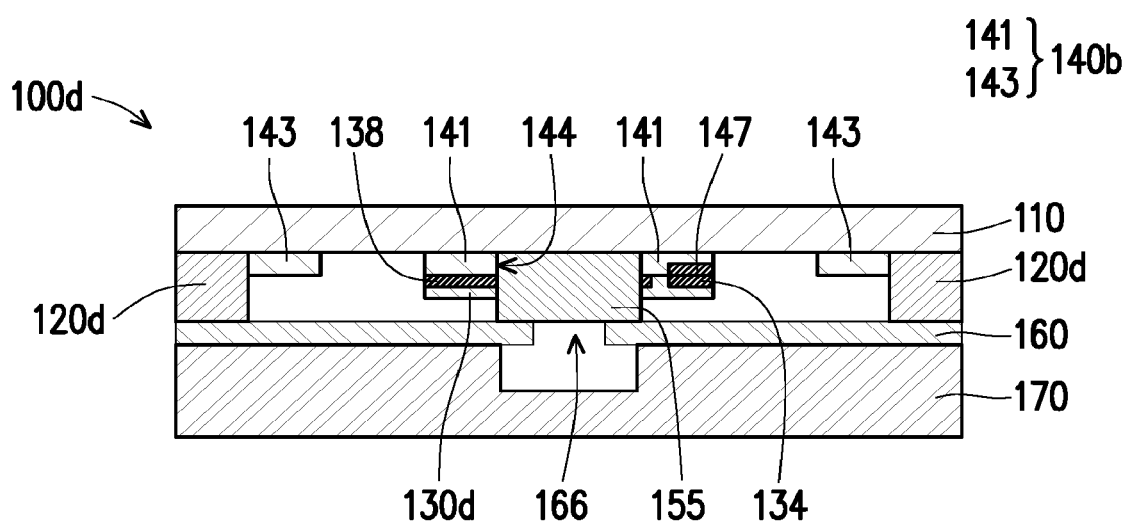
FIG. 11 is a schematic cross-sectional view illustrating the fluid driving device depicted in FIG. 9.

FIG. 9 is a schematic exploded view of a fluid driving device according to a fifth embodiment of the disclosure. FIG. 10 is a schematic view of FIG. 9 at another view angle. FIG. 11 is a schematic cross-sectional view illustrating the fluid driving device depicted in FIG. 9. With reference to FIG. 9 to FIG. 11, the difference between the fluid driving device 100d provided in the present embodiment and the fluid driving device 100b provided in the embodiment shown in FIG. 7 lies in that the second central zone 141 of the transmission unit 140b provided in the embodiment shown in FIG. 7 does not have any opening that allows the protrusion 155 to pass through, and the piezoelectric element does not have any through hole that allows the protrusion 155 to pass through.

As shown in FIG. 9, in the present embodiment, the piezoelectric element 130d has a ring shape and includes a through hole 131. The transmission unit 140d includes an opening 144 corresponding to the through hole 131. The protrusion 155 passes through the through hole 131 of the piezoelectric element 130d and the opening 144 of the transmission unit 140d and is fixed to the first central zone 112 of the vibration unit 110.

As shown in FIG. 11, in this embodiment, the thickness of the frame 120d is substantially the same as the thickness of the protrusion 155, and the frame 120 and the protrusion 155 can be made of the same object, which simplifies the manufacturing process. Besides, a lower surface of the frame 120d can be ensured to be aligned to a lower surface of the protrusion 155, thus leading to a relatively small tolerance. Moreover, as shown in FIG. 11 and provided in the embodiment, the central location of the fluid driving device 100d (e.g., a location between the first central zone 112 of the vibration unit 110 in FIG. 9 and the fourth central zone 162 of the valve plate 160) can be said to be the primary functional zone of the fluid driving device 100d. According to the present embodiment, since the first central zone 112 of the vibration unit 110 and the fourth central zone 162 of the plane unit 160 are separated only by the protrusion 155, the number of components at the central location of the fluid driving device 100d is small. Accordingly, the fluid driving device 100d has good precision.

To sum up, the signal transmission layer, the piezoelectric element, and the plane unit of the fluid driving device provided in the disclosure are respectively located on the same side of the vibration unit and are sequentially stacked. The signal transmission layer configured to be electrically connected to the first electrode and the second electrode of the piezoelectric element is located between the vibration unit and the plane unit; that is, the signal transmission layer is mostly formed inside the fluid driving device and can be better protected. In addition, in an embodiment, the signal transmission layer is formed in one layer and can be formed at the same transmission unit, for instance. Thereby, the number of components of the fluid driving device is relatively mall, the number of layers of the fluid driving device is also small, the assembling process is relatively simple and convenient, and the overall tolerance can be reduced.

Although the disclosure has been disclosed in the above embodiments, it is not intended to limit the disclosure, and any one of ordinary skill in the art can make some changes and refinements without departing from the spirit and scope of the disclosure. The scope of the disclosure is defined by the scope of the appended claims.

What is claimed is:

1. A fluid driving device comprising:
   a vibration unit;
   a signal transmission layer comprising a first conductive zone and a second conductive zone;
   a piezoelectric element comprising a first electrode and a second electrode electrically isolated from each other, the first electrode of the piezoelectric element being electrically connected to the first conductive zone of the signal transmission layer, the second electrode of the piezoelectric element being electrically connected to the second conductive zone of the signal transmission layer; and a plane unit having at least one hole, the signal transmission layer, the piezoelectric element, and the plane unit being respectively located on one side of the vibration unit and sequentially stacked together;

a transmission unit located between the vibration unit and the piezoelectric element, the transmission unit being a flexible printed circuit board;

a frame, wherein the vibration unit includes a first central zone and a first peripheral zone, and the frame is disposed between the first peripheral zone and the plane unit;

a protrusion disposed at a location corresponding to the at least one hole and between the first central zone and the plane unit and protruding toward the at least one hole, wherein a surface of the frame facing the plane unit is coplanar with a surface of the protrusion facing the plane unit;

wherein the frame is fixed to the first peripheral zone of the vibration unit.

2. The fluid driving device of claim 1, wherein the piezoelectric element comprises a through hole, and the protrusion passes through the through hole.

3. The fluid driving device of claim 2, wherein the transmission unit includes an opening corresponding to the through hole, the protrusion passes through the opening and is fixed to the first central zone of the vibration unit.

4. The fluid driving device of claim 1, wherein a thickness of the first peripheral zone being greater than a thickness of the first central zone.

5. The fluid driving device of claim 4, wherein the protrusion is located on a surface of the piezoelectric element facing the plane unit.

* * * * *